(12) United States Patent
Chen et al.

(10) Patent No.: US 11,682,679 B2
(45) Date of Patent: Jun. 20, 2023

(54) MANUFACTURING METHOD OF DISPLAY SUBSTRATE FOR REMOVING RESIDUAL SAND

(71) Applicants: Hefei Xinsheng Optoelectronics Technology Co., Ltd., Anhui (CN); BOE Technology Group Co., Ltd., Beijing (CN)

(72) Inventors: Lin Chen, Beijing (CN); Chengshao Yang, Beijing (CN); Tao Ma, Beijing (CN); Dengfeng Wang, Beijing (CN); Ling Han, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

( * ) Notice: Subject to any disclaimer, the term of this patent is extended or adjusted under 35 U.S.C. 154(b) by 199 days.

(21) Appl. No.: 17/007,568

(22) Filed: Aug. 31, 2020

(65) Prior Publication Data

US 2021/0111199 A1    Apr. 15, 2021

(30) Foreign Application Priority Data

Oct. 10, 2019 (CN) .......................... 201910958015.1

(51) Int. Cl.
*H01L 27/12* (2006.01)
*H01L 21/311* (2006.01)
(Continued)

(52) U.S. Cl.
CPC .... *H01L 27/1259* (2013.01); *H01L 21/31111* (2013.01); *H01L 21/31116* (2013.01);
(Continued)

(58) Field of Classification Search
CPC ............. H01L 27/1259; H01L 27/1248; H01L 27/3258; H01L 27/1225; H01L 27/1262;
(Continued)

(56) References Cited

U.S. PATENT DOCUMENTS

2006/0157836 A1* 7/2006 Park ..................... H01L 27/1214
438/149
2018/0012947 A1* 1/2018 Lee ...................... H01L 27/3265

FOREIGN PATENT DOCUMENTS

CN         1808709 A     7/2006
CN       103094204 A     5/2013
(Continued)

OTHER PUBLICATIONS

Office Action dated Jul. 2, 2021 issued in corresponding Chinese Application No. 201910958015.1.

*Primary Examiner* — Nilufa Rahim
(74) *Attorney, Agent, or Firm* — Nath, Goldberg & Meyer; Joshua B. Goldberg

(57) ABSTRACT

The present disclosure provides a manufacturing method of a display substrate, a display substrate and a display device, belongs to the field of display technology, and can at least partially solve a problem of residual sand in the display substrate. The manufacturing method of the display substrate includes: providing a base; forming a passivation layer on a surface of the base; forming an amorphous oxide conductive material layer on a surface of the passivation layer facing away from the base; forming a photoresist pattern on the oxide conductive material layer, the photoresist pattern having an exposure region; etching a portion of the oxide conductive material layer in the exposure region of the photoresist pattern to form a hollow position exposing a portion of the passivation layer; and removing a certain
(Continued)

thickness material of the portion of the passivation layer exposed through the hollow position.

11 Claims, 4 Drawing Sheets

(51) Int. Cl.
    *H01L 21/3213*     (2006.01)
    *G02F 1/1343*     (2006.01)
    *H10K 50/81*     (2023.01)
    *H10K 71/00*     (2023.01)

(52) U.S. Cl.
    CPC .... *H01L 21/32134* (2013.01); *H01L 27/1248* (2013.01); *G02F 1/13439* (2013.01); *H10K 50/81* (2023.02); *H10K 71/621* (2023.02)

(58) Field of Classification Search
    CPC .............. H01L 27/1218; H01L 27/124; H01L 21/31111; H01L 21/31116; H01L 21/32134; H01L 21/3065; H01L 21/3085; H01L 51/0023; H01L 51/5206; G02F 1/13439
    See application file for complete search history.

(56) References Cited

FOREIGN PATENT DOCUMENTS

CN           106847757 A     6/2017
JP           2009272108 A   * 11/2009

* cited by examiner

MANUFACTURING METHOD OF DISPLAY SUBSTRATE FOR REMOVING RESIDUAL SAND

CROSS REFERENCE TO RELATED APPLICATIONS

The present application claims priority to Chinese patent application No. 201910958015.1 filed to the Chinese intellectual property office on Oct. 10, 2019, the entire contents of which are incorporated herein by reference.

TECHNICAL FIELD

The present application relates to the field of display technology, and particularly relates to a manufacturing method of a display substrate, a display substrate and a display device.

BACKGROUND

A display substrate in the related art generally has a structure in which a driving circuit layer is fabricated on a glass or flexible base, and then electrodes are fabricated on the driving circuit layer. The driving circuit layer typically includes a driving transistor, and an uppermost surface of the driving circuit layer is typically a passivation layer. An amorphous transparent oxide conductive material such as Indium Tin Oxide (ITO) is usually provided as an electrode above the passivation layer.

SUMMARY

According to a first aspect of the present disclosure, there is provided a manufacturing method of a display substrate, including: providing a base; forming a passivation layer on a surface of the base; forming an amorphous oxide conductive material layer on a surface of the passivation layer facing away from the base; forming a photoresist pattern on a surface of the oxide conductive material layer facing away from the base, wherein the photoresist pattern has an exposure region, and a portion of photoresist in the exposure region is removed so that a portion of the oxide conductive material layer at a position corresponding to the exposure region is exposed; etching the portion of the oxide conductive material layer in the exposure region of the photoresist pattern to form a hollow position exposing a portion of the passivation layer; and removing a certain thickness material of the portion of the passivation layer exposed through the hollow position.

In some implementations, the passivation layer includes a first passivation sub-layer and a second passivation sub-layer which are stacked and made of a same material, the second passivation sub-layer is more compact than the first passivation sub-layer, and wherein the first passivation sub-layer is further away from the base than the second passivation sub-layer, and the removing the certain thickness material of the portion of the passivation layer exposed through the hollow position includes: removing at least a certain thickness material of a portion of the first passivation sub-layer exposed through the hollow position.

In some implementations, the removing the certain thickness material of the portion of the first passivation sub-layer exposed through the hollow position includes: completely removing the portion of the first passivation sub-layer exposed through the hollow position.

In some implementations, the portion of the oxide conductive material layer in the exposure region of the photoresist pattern is wet etched by using a first etching solution.

In some implementations, the completely removing the portion of the first passivation sub-layer exposed through the hollow position includes: performing a wet etching on the portion of the first passivation sub-layer exposed through the hollow position by using a second etching solution.

In some implementations, the passivation layer is made of silicon oxide or silicon nitride, the oxide conductive material layer is wet-etched by using the first etching solution, and the first etching solution and the second etching solution have a same composition and both contain hydrofluoric acid.

In some implementations, in the second etching solution, a mass ratio a of hydrofluoric acid to the second etching solution satisfies: $0.15\% \leq a \leq 0.45\%$.

In some implementations, the removing at least the certain thickness material of the portion of the first passivation sub-layer exposed through the hollow position includes: etching the portion of the first passivation sub-layer exposed through the hollow position by adopting an anisotropic plasma etching process to a preset depth in the first passivation sub-layer, and then stopping etching; and etching the remaining material of the portion of the first passivation sub-layer exposed through the hollow position by adopting an isotropic plasma etching process.

In some implementations, the isotropic plasma etching process and the anisotropic plasma etching process use a same process gas; a bias power for the isotropic plasma etching process is smaller than a source power; a bias power for the anisotropic plasma etching process is greater than or equal to the source power.

In some implementations, the isotropic plasma etching process and the anisotropic plasma etching process use a same process gas, a source power for the isotropic plasma etching process is the same as a source power for the anisotropic plasma etching process, and a bias power for the isotropic plasma etching process is less than a bias power for the anisotropic plasma etching process.

In some implementations, a material of the passivation layer includes silicon oxide or silicon nitride, the process gas used in the anisotropic plasma etching process and the isotropic plasma etching process includes $SF_6$ and $Cl_2$.

In some implementations, the source power is 30 KW, the bias power for the anisotropic plasma etching process is 30 KW, and the bias power for the isotropic plasma etching process is 15 KW.

In some implementations, gas flow rates of $SF_6$ and $Cl_2$ are 800 sccm and 8000 sccm, respectively.

According to a second aspect of the present disclosure, there is provided a display substrate including a base, a passivation layer arranged on a surface of the base, and an oxide conductive material layer arranged on a surface of the passivation layer facing away from the base; the oxide semiconductor layer has a patterned hollow region; the passivation layer has a groove at a position corresponding to the hollow region of the oxide conductive material layer, and a groove bottom of the groove is located in the passivation layer.

In some implementations, the passivation layer includes a first passivation sub-layer and a second passivation sub-layer which are stacked, the first passivation sub-layer and the second passivation sub-layer are made of a same material, and the second passivation sub-layer is more compact than the first passivation sub-layer, wherein the first passivation sub-layer is further away from the base than the second passivation sub-layer, and the groove bottom of the groove is located at an interface between the first passivation sub-layer and the second passivation sub-layer or within the first passivation sub-layer.

According to a third aspect of the present disclosure, there is provided a display device including the display substrate according to the second aspect of the present disclosure.

DESCRIPTION OF EMBODIMENTS

In order to make a person skilled in the art better understand the technical solutions of the present disclosure, the present disclosure will be further described in detail below with reference to the accompanying drawings and the detailed description.

Crystalline particles (called residual sand) are inevitable during manufacturing an amorphous oxide conductive material. These crystalline particles cannot be removed in a typical etching process for an amorphous oxide material. The residual crystalline particles may adversely affect the display effect, for example, phenomenon of residual image is aggravated.

Figure 1:
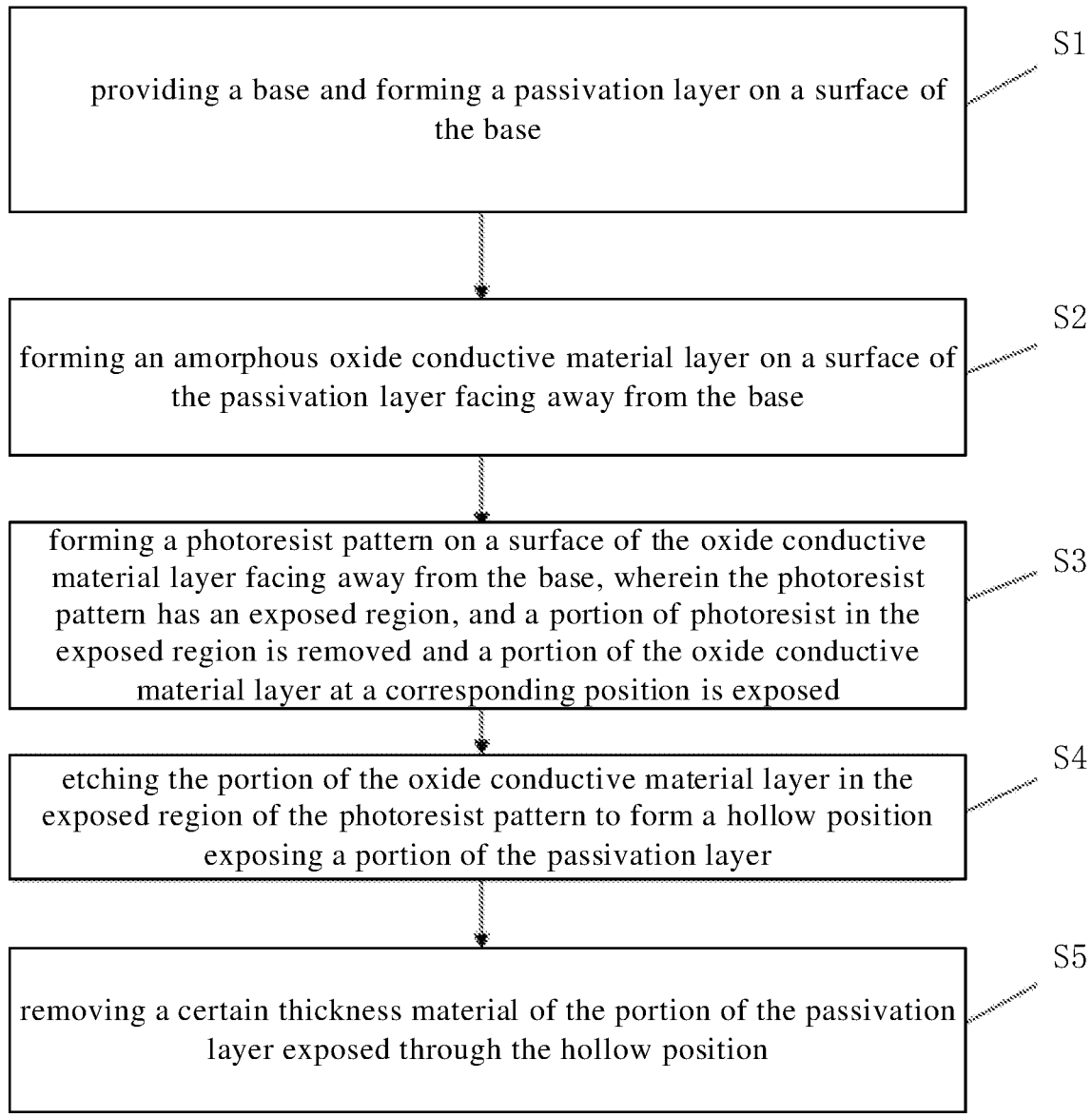
FIG. 1 is a flowchart of a method of forming an amorphous oxide pattern on a passivation layer according to an embodiment of the present invention.

An embodiment of the present disclosure provides a manufacturing method of a display substrate, referring to FIG. 1, including the following steps S1 to S5.

At Step S1, a base is provided and a passivation layer is formed on the base.

At step S2, an amorphous oxide conductive material layer is formed on a side of the passivation layer facing away from the base.

At Step S3, a photoresist pattern is formed on the oxide conductive material layer, where the photoresist pattern has an exposure region, and a portion of photoresist in the exposure region is removed so that a portion of the oxide conductive material layer at a position corresponding to the exposure region is exposed.

At step S4, the portion of the oxide conductive material layer in the exposure region of the photoresist pattern is etched to form a hollow position.

At step S5, a certain thickness material of a portion of the passivation layer material exposed through the hollow position in the exposure region of the photoresist pattern is removed.

In step S4, it is unavoidable to cause residual sand in different degrees, and in step S5, a relatively thin layer of the passivation layer is removed from the bad region (i.e., the exposure region of the photoresist pattern) where the residual sand occurs, so that the residual sand is removed together with the removed material of the passivation layer. Certainly, in order to avoid affecting the performance of the passivation layer, the material of the passivation layer that is removed should be relatively thin compared to an original thickness of the passivation layer.

The inventors have found that in a process of forming the passivation layer on the base, process parameters (e.g. deposition rate) can be controlled such that a surface portion of the passivation layer away from the base is more loose relative to a portion of the passivation layer located below the surface portion, and thus the surface portion of the passivation layer is more easily removed. How to remove a certain thickness material of the passivation layer, i.e., remove the surface portion of the passivation layer, is described below based on such a structure. Certainly, even if the surface portion of the passivation layer is compact, a certain thickness material of the passivation layer can also be removed in related art.

Figure 2A:
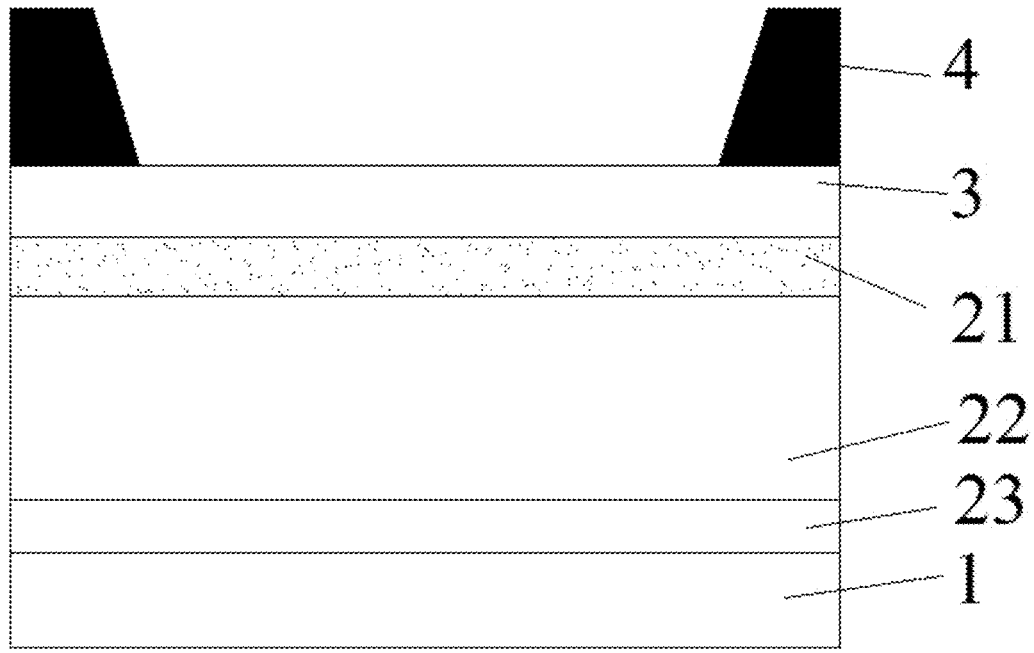
FIGS. 2a to 2d are cross-sectional views of a product at various stages in an example of forming an amorphous oxide pattern on a passivation layer according to an embodiment of the present invention.
Figure 2B:
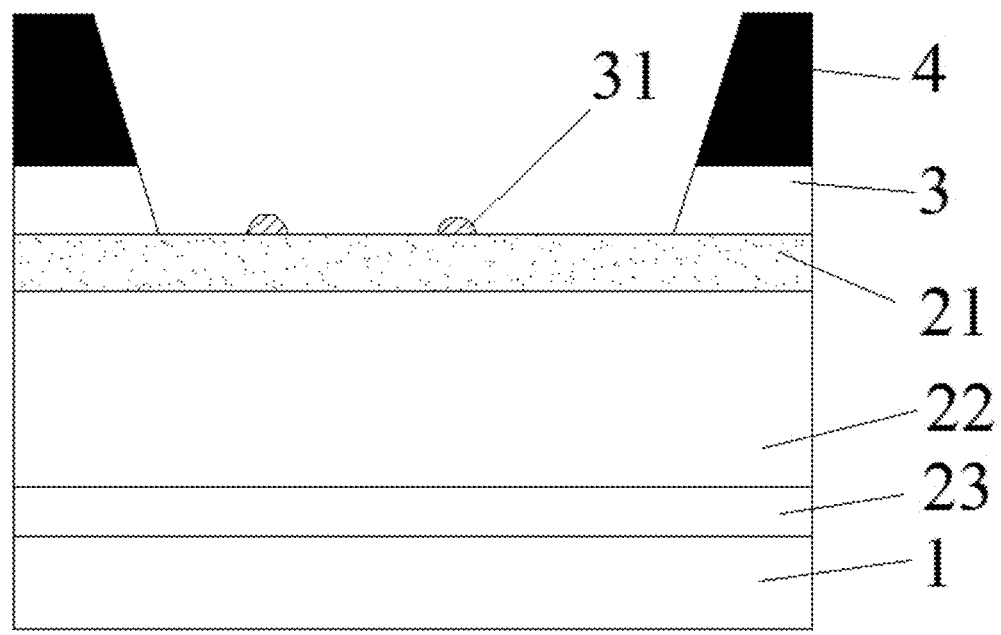
Figure 2C:
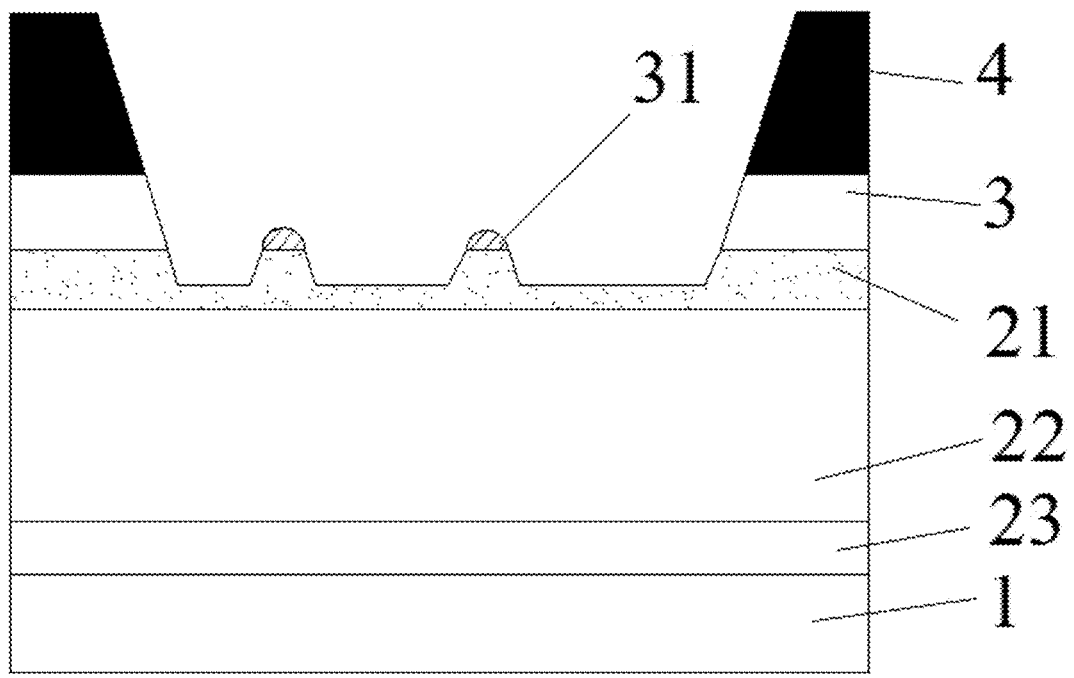
Figure 2D:
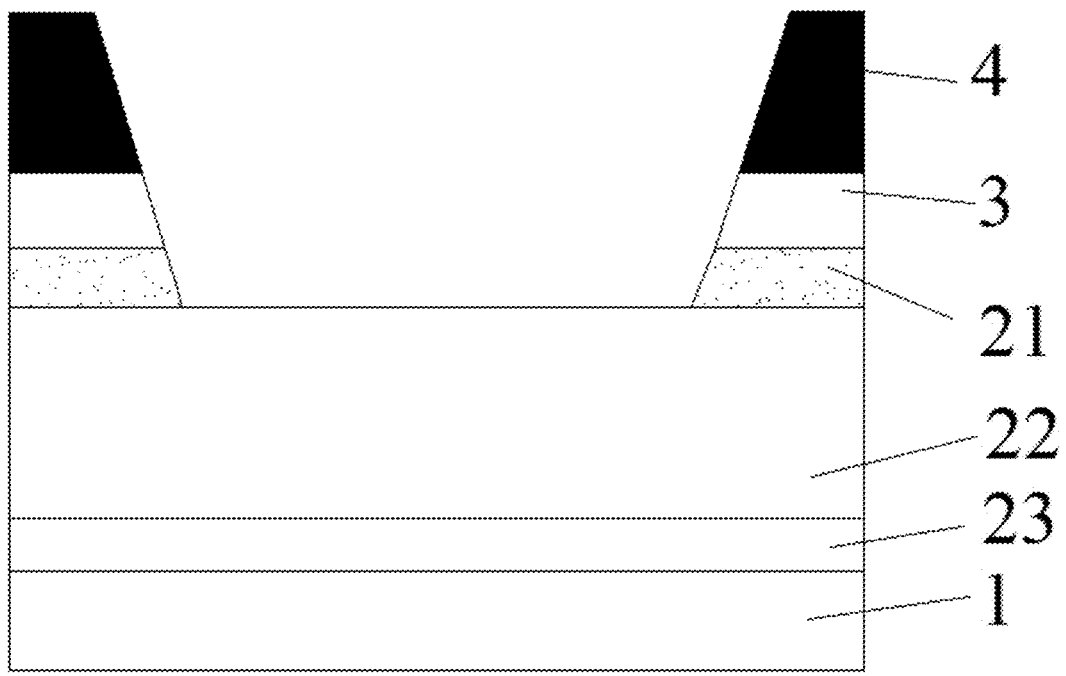

With reference to FIGS. 2a to 2d, the passivation layer includes a first passivation sub-layer 21 and a second passivation sub-layer 22 which are superimposed, the first passivation sub-layer 21 and the second passivation sub-layer 22 are made of a same material and the second passivation sub-layer 22 is more compact than the first passivation sub-layer 21, the first passivation sub-layer 21 is further away from the base 1 than the second passivation sub-layer 22. Removing the certain thickness material of the portion of the passivation layer within the exposure region of the photoresist pattern 4 includes: removing at least a certain thickness material of a portion of the first passivation sub-layer 21 within the exposure region of the photoresist pattern 4, where a certain thickness material of the portion of the first passivation sub-layer 21 within the exposure region of the photoresist pattern 4 is remained (as shown in FIG. 2c) or the portion of the first passivation sub-layer 21 within the exposure region of the photoresist pattern 4 is completely removed (as shown in FIG. 2d).

Specifically, in Step S1, the base 1 is provided, the passivation layer is formed on the base 1, the passivation layer includes the first passivation sub-layer 21 and the second passivation sub-layer 22 which are stacked, the first passivation sub-layer 21 and the second passivation sub-layer 22 are made of the same material, and the second passivation sub-layer 22 is more compact in structure than the first passivation sub-layer 21, and the first passivation sub-layer 21 is further away from the base 1 than the second passivation sub-layer 22.

During manufacturing the display substrate, a driving circuit layer (not shown) is generally formed on the base 1. A surface of the driving circuit layer away from the base is usually formed with the passivation layer. The driving circuit layer is provided with transistors and wirings therein, which may be provided according to the related art, and is not specifically shown. Referring to FIG. 2a, in the present embodiment, the passivation layer includes a third passivation sub-layer 23, the second passivation sub-layer 22, and the first passivation sub-layer 21 which are stacked in sequence in a direction away from the base 1. The first passivation sub-layer 21 has a relatively loose structure and is easily etched away, and may be used as an etching guide layer for etching the passivation layer. The second passivation sub-layer 22 has a compact structure and is not easily etched away. In contrast, the first passivation sub-layer 21 is softer and less compact, while the second passivation sub-layer 22 is harder and more compact. The difference between the first passivation sub-layer 21 and the second passivation sub-layer 22 can be achieved by controlling a deposition rate of a deposition process when forming the passivation layer. Generally, a slower deposition rate results in a more compact passivation layer. The third passivation sub-layer 23 serves to buffer an uneven surface of an underlying structure (not shown) and may also be referred to as a buffer passivation sub-layer. The first passivation sub-layer 21 and the third passivation sub-layer 23 may have thicknesses much smaller than a thickness of the second passivation sub-layer 22. In some implementations, the thickness of the first passivation sub-layer 21 is 120 Å, the thickness of the second passivation sub-layer 22 is 5780 Å, and the thickness of the third passivation sub-layer 23 is 100 Å.

Specifically, in Step S2, the amorphous oxide conductive material layer 3 is formed on the side of the first passivation sub-layer 21 facing away from the second passivation sub-layer 22.

An amorphous indium tin oxide (a-ITO) film is formed, for example, by a sputtering process, on the side of the first passivation sub-layer 21 facing away from the second passivation sub-layer 22. Certainly, any other type of transparent amorphous oxide conductive film may be formed. In this step, it is inevitable that a small amount of crystalline indium tin oxide particles (i.e., residual sand 31) are formed.

Specifically, in Step S3, the photoresist pattern 4 is formed on the side of the oxide conductive material layer 3 facing away from the first passivation sub-layer 21, the photoresist pattern 4 has the exposure region, the portion of photoresist in the exposure region is removed and the portion of the oxide conductive material layer 3 at the position corresponding to the exposure region is exposed. The portion of oxide conductive material layer 3 in the exposure region is expected to be removed. The morphology of the product after this step is completed is shown in FIG. 2a.

The photoresist pattern 4 may be formed on the oxide conductive material layer 3 by processes including coating photoresist, exposing, and developing.

Specifically, in Step S4, the portion of the oxide conductive material layer 3 in the exposure region of the photoresist pattern 4 is etched.

In some implementations, the portion of the oxide conductive material layer 3 in the exposure region of the photoresist pattern 4 is specifically wet etched by using a first etching solution.

Amorphous indium tin oxide generally can be wet etched by using an acidic solution (e.g., a sulfuric acid solution and/or a nitric acid solution). Certainly, even though a dry etching is adopted, etching efficiencies for amorphous indium tin oxide and crystalline indium tin oxide are different from each other. As shown in FIG. 2b, residual sand 31 is generated after this step is completed.

Specifically, in Step S5, at least a certain thickness material of the portion of the first passivation sub-layer 21 at the hollow position in the exposure region of the photoresist pattern 4 is removed.

Since the portion of the first passivation sub-layer 21 in the exposure region of the photoresist pattern 4 is removed or a relatively thin layer of material of the portion of the first passivation sub-layer 21 in the exposure region of the photoresist pattern 4 is removed, the residual sand 31 attached to the first passivation sub-layer 21 is also removed. In the LCD technology, taking forming a pixel electrode pattern or a common electrode pattern by etching amorphous ITO as an example, pixel electrodes are separated by other insulating material (such as an alignment layer) later, so that an absence of the first passivation sub-layer 21 between the pixel electrodes does not affect the function of the display substrate. If the display substrate is used for manufacturing an organic light emitting diode display panel, the pixel electrodes are separated by a pixel defining layer formed later. FIG. 2d shows a case where the portion of the first passivation sub-layer 21 in the exposure region of the photoresist pattern 4 is completely removed.

In some implementations, in Step S5, the portion of the first passivation sub-layer 21 in the exposure region of the photoresist pattern 4 is wet-etched by using a second etching solution. Referring to FIG. 2d, since wet etching has a certain isotropic characteristic, a portion of the first passivation sub-layer 21 under the residual sand 31 is also etched away, so that the residual sand 31 falls off.

In some implementations, the passivation layer is made of silicon oxide or silicon nitride, and the oxide conductive material layer 3 is wet-etched by using a first etching solution, where the first etching solution and the second etching solution have a same composition and both contain hydrofluoric acid.

That is, hydrofluoric acid for etching the passivation layer is doped in the etching solution for etching the oxide conductive material layer 3. Therefore, the oxide conductive material layer 3 and the first passivation layer can be etched in a single process chamber by adopting a same etching solution in sequence without replacing the etching solution.

It should be noted that, since the second passivation sub-layer 22 has a more compact structure than the first passivation sub-layer 21, and a difference of compactness therebetween is generally relative large, the second passivation sub-layer 22 cannot be etched by reasonably controlling an etching time, that is, a concentration of acidic substance in the second etching solution.

In some implementations, in the second etching solution, a mass ratio a of hydrofluoric acid to the second etching solution satisfies: $0.15\% \leq a \leq 0.45\%$. If the concentration of hydrofluoric acid is too low, the etching efficiency for the first passivation sub-layer 21 is relative low, and if the concentration of hydrofluoric acid is too high, it is not conductive to control the etching time, that is, the second passivation sub-layer 22 is easily etched significantly.

Figure 3A:
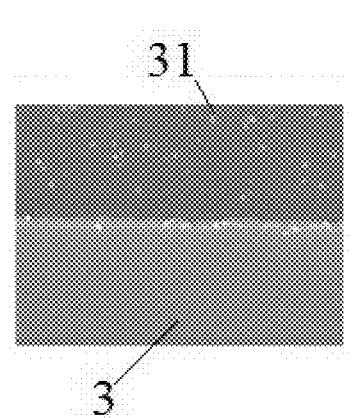
FIGS. 3a to 3d are microscope views of a product in an experimental example of forming an amorphous oxide pattern on a passivation layer according to an embodiment of the present invention.
Figure 3B:
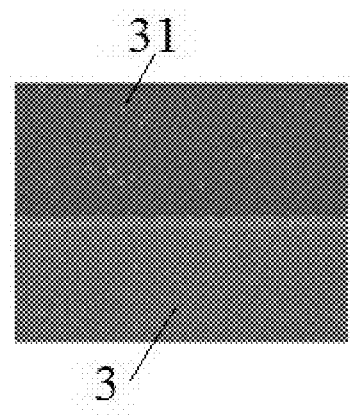
Figure 3C:
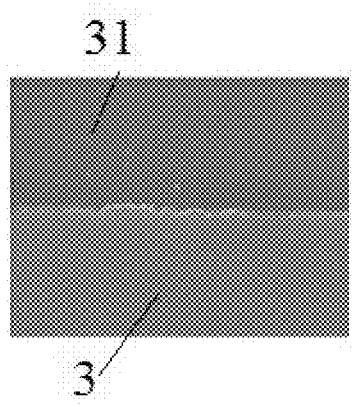
Figure 3D:
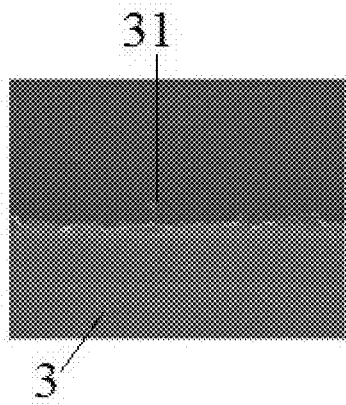

FIG. 3a is a microscopic view of a product after a conventional wet etching is performed on the oxide conductive material layer 3 without adopting the above method. FIGS. 3b to 3d are microscope views of a product after the first passivation sub-layer 21 is etched by using the second etching solution (the same as the first etching solution) containing HF in the mass ratio of 0.15%, 0.3%, and 0.45%, respectively, according to the method of the present embodiment. It can be seen that a density of residual sands 31 decreases as a content of HF in the second etching liquid increases.

In some implementations, in Step S5, the portion of the first passivation sub-layer 21 in the exposure region is etched to a preset depth in the first passivation sub-layer 21 by using an anisotropic plasma etching process, and then stopping etching; the remaining material of the portion of the first passivation sub-layer 21 is subsequently etched by using an isotropic plasma etching process.

As shown in FIG. 2c, the portion of the first passivation sub-layer 21 at a position where no residual sand 31 is attached may be etched to a certain depth by the anisotropic plasma etching process, so that an "island" is formed at a position where the residual sand 31 is located, and a portion of the first passivation sub-layer 21 below the residual sand 31 has a relative small size in a horizontal direction. In a subsequent isotropic plasma etching process, the portion of the first passivation layer 21 under the residual sand 31 is exposed and more easily removed, thereby the residual sand 31 falls off together therewith.

In some implementations, the isotropic plasma etching process and the anisotropic plasma etching process use the same process gas; a bias power for the isotropic plasma etching process is smaller than a source power; a bias power for the anisotropic plasma etching process is greater than or equal to the source power.

The process gas is a gas used to excite a plasma. The source power is a power of an electric field for exciting the plasma. The bias power is a power of the electric field that attracts positive ions in the plasma to move. Namely, by adopting the same process gas, a plasma etching process with different properties may be realized by only changing a magnitude relation between the bias power and the source power. The larger the bias power is, the more obvious the directional movement of the positive ions in the plasma is, and the more obvious the physical bombardment effect is, so that the more prominent the anisotropic characteristic of the etching is.

In some implementations, the isotropic plasma etching process and the anisotropic plasma etching process use the same process gas, the source power for the isotropic plasma etching process is the same as the source power for the anisotropic plasma etching process, the bias power for the isotropic plasma etching process is less than the bias power for the anisotropic plasma etching process.

Therefore, in a single process chamber, the plasma etching process with two properties can be realized by only changing the magnitude of the bias power.

Figure 4A:
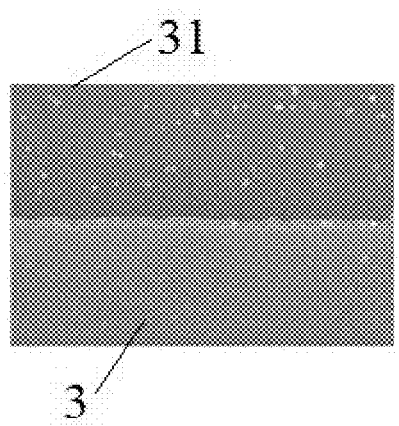
FIGS. 4a to 4b are microscope views of a product in an experimental example of forming an amorphous oxide pattern on a passivation layer according to an embodiment of the present invention.
Figure 4B:
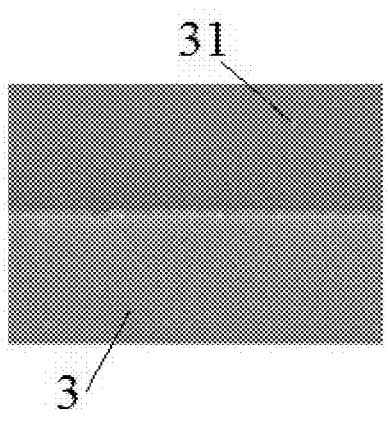

In some implementations, a material of the passivation layer includes silicon oxide or silicon nitride, and the process gas includes $SF_6$ and $Cl_2$. In this case, in an embodiment, the source power is 30 KW, the bias power for the anisotropic plasma etching process is 30 KW, and the bias power for the isotropic plasma etching process is 15 KW. The gas flow rates for $SF_6$ and $Cl_2$ are 800 sccm and 8000 sccm, respectively. An overall gas pressure within the process chamber is controlled to be less than 20 mtorr, preferably be equal to 10 mtorr, thus better experimental results can be obtained. FIG. 4a shows a microscope view after the amorphous indium tin oxide layer being etched by only a conventional etching solution. FIG. 4b is a microscope view of the product obtained after the plasma etching process with two different properties is used with the above parameter configuration. It is easy to see that an amount and a density of the residual sand 31 are greatly reduced by the method provided in this embodiment.

It should be noted that the portion of the first passivation sub-layer 21 in the exposure region of the photoresist pattern 4 may be completely removed, certainly, a certain thickness material of the portion of the first passivation sub-layer 21 in the exposure region of the photoresist pattern 4 may be remained. It should be ensured that the removed material of the first passivation layer 21 is in a single body and has a certain thickness, so as to ensure that the residual sand 31 is removed together with the removed material of the first passivation layer 21. Certainly, for simplify the process control, and in addition to the fact that the first passivation sub-layer generally can be provided relatively thin, it is preferred to completely remove the portion of the first passivation sub-layer 21 in the exposure region of the photoresist pattern 4.

An embodiment of the present disclosure further provides a display substrate manufactured according to the manufacturing method of above embodiment.

In the display substrate, a portion of the passivation layer under the oxide conductive material layer 3 is relatively thick, and a portion of the passivation layer in a region around the region covered by the oxide conductive material layer 3 is relatively thin.

Since the amount and the density of the residual sand 31 are reduced, the display failure due to the residual sand 31 is suppressed accordingly.

In the present embodiment, with reference to FIG. 2d, the display substrate includes a base 1, a passivation layer 3 disposed on the base 1, and an oxide conductive material layer 3 disposed on a side of the passivation layer facing away from the base 1, where the oxide conductive material layer 3 has a patterned hollow region; the passivation layer has a groove at a position corresponding to the hollow region of the oxide conductive material layer 3, and a groove bottom of the groove is formed in the passivation layer.

In some implementations, the passivation layer has a first passivation sub-layer 21 and a second passivation sub-layer 22 which are stacked, the first passivation sub-layer 21 and the second passivation sub-layer 22 are made of a same material and the second passivation sub-layer 22 is more compact than the first passivation sub-layer 21, where the first passivation sub-layer 21 is further away from the base than the second passivation sub-layer 22, and the groove bottom of the groove is formed at an interface between the first passivation sub-layer 21 and the second passivation sub-layer 22 or within the first passivation sub-layer 21.

Obviously, the display substrate can be manufactured by the manufacturing method of above embodiment, thereby reducing the residual sand.

An embodiment of the present disclosure also provides a display device including the display substrate of the foregoing embodiment.

Specifically, the display device may be any product or component having a display function, such as a liquid crystal display panel, an Organic Light Emitting Diode (OLED) display panel, electronic paper, a mobile phone, a tablet computer, a television, a display, a notebook computer, a digital photo frame, and a navigator.

It will be understood that the above embodiments are merely exemplary embodiments adopted to illustrate the principles of the present invention, and the present invention is not limited thereto. It will be apparent to those skilled in the art that various modifications and variants can be made without departing from the spirit and scope of the invention, and such modifications and variants are considered to be within the scope of the present disclosure.

What is claimed is:

1. A manufacturing method for a display substrate, comprising:
   providing a base;
   forming a passivation layer on a surface of the base;
   forming an amorphous oxide conductive material layer on a surface of the passivation layer facing away from the base;
   forming a photoresist pattern on a surface of the oxide conductive material layer facing away from the base, wherein the photoresist pattern has an exposure region, and a portion of photoresist in the exposure region is removed and a portion of the oxide conductive material layer at a position corresponding to the exposure region is exposed;
   etching the portion of the oxide conductive material layer in the exposure region of the photoresist pattern to form a hollow position exposing a portion of the passivation layer; and removing a certain thickness material of the portion of the passivation layer exposed through the hollow position, wherein the passivation layer comprises a first passivation sub-layer and a second passivation sub-layer which are stacked and made of a same material, the second passivation sub-layer is more compact than the first passivation sub-layer, and wherein the first passivation sub-layer is further away from the base than the second passivation sub-layer, and wherein the removing the certain thickness material of the portion of the passivation layer exposed through the hollow position comprises: removing at least a certain thickness material of a portion of the first passivation sub-layer exposed through the hollow position, wherein the removing the certain thickness material of the portion of the first passivation sub-layer exposed through the hollow position comprises:

etching a preset depth of the first passivation sub-layer exposed through the hollow position by adopting an anisotropic plasma etching process, and then stopping etching; and etching the remaining material of the first passivation sub-layer by adopting an isotropic plasma etching process.

2. The manufacturing method according to claim 1, wherein the removing the certain thickness material of the portion of the first passivation sub-layer exposed through the hollow position comprises: completely removing the portion of the first passivation sub-layer exposed through the hollow position.

3. The manufacturing method according to claim 1, wherein the portion of the oxide conductive material layer in the exposure region of the photoresist pattern is wet etched by using a first etching solution.

4. The manufacturing method according to claim 3, wherein the removing the certain thickness material of the portion of the first passivation sub-layer exposed through the hollow position comprises: performing a wet etching on the portion of the first passivation layer exposed through the hollow position by using a second etching solution.

5. The manufacturing method according to claim 4, wherein the passivation layer is made of silicon oxide or silicon nitride, the oxide conductive material layer is wet-etched by using the first etching solution, and the first etching solution and the second etching solution have a same composition and both contain hydrofluoric acid.

6. The manufacturing method according to claim 4, wherein a mass ratio a of hydrofluoric acid to the second etching solution satisfies: $0.15\% \leq a \leq 0.45\%$.

7. The manufacturing method according to claim 1, wherein the isotropic plasma etching process and the anisotropic plasma etching process use a same process gas; a bias power for the isotropic plasma etching process is smaller than a source power; a bias power for the anisotropic plasma etching process is greater than or equal to the source power.

8. The manufacturing method according to claim 1, wherein the isotropic plasma etching process and the anisotropic plasma etching process use a same process gas, a source power for the isotropic plasma etching process is the same as a source power for the anisotropic plasma etching process, and a bias power for the isotropic plasma etching process is less than a bias power for the anisotropic plasma etching process.

9. The manufacturing method according to claim 1, wherein a material of the passivation layer comprises silicon oxide or silicon nitride, a process gas used in the anisotropic plasma etching process and the isotropic plasma etching process comprises SF6 and Cl2.

10. The manufacturing method according to claim 9, wherein the source power is 30 KW, the bias power for the anisotropic plasma etching process is 30 KW, and the bias power for the isotropic plasma etching process is 15 KW.

11. The manufacturing method according to claim 9, wherein gas flow rates of SF6 and Cl2 are 800sccm and 8000sccm, respectively.

* * * * *